United States Patent
Hao

(10) Patent No.: US 11,209,465 B2
(45) Date of Patent: Dec. 28, 2021

(54) MULTI-PHASE SENSING AND CONTROL USING A COMBINATION OF LINE POST SENSORS AND WIRELESS CURRENT SENSORS

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 239 days.

(21) Appl. No.: 16/580,455

(22) Filed: Sep. 24, 2019

(65) Prior Publication Data

US 2021/0088555 A1   Mar. 25, 2021

(51) Int. Cl.
*H02J 3/18* (2006.01)
*G01R 15/18* (2006.01)

(52) U.S. Cl.
CPC .............. *G01R 15/18* (2013.01); *H02J 3/18* (2013.01)

(58) Field of Classification Search
CPC .... G01R 15/18; G01R 15/183; G01R 31/016; H02J 3/18; H02J 13/00022; H02J 13/00002; Y02E 60/00; Y02E 40/30; Y02E 40/70; Y04S 40/126; Y04S 10/30; Y04S 10/22
See application file for complete search history.

(56) References Cited

U.S. PATENT DOCUMENTS

| 3,968,432 A * | 7/1976 | Kelley, Jr. ............ | G01R 15/142 324/107 |
| 2008/0106241 A1* | 5/2008 | Deaver ................. | H02J 3/1828 323/209 |

* cited by examiner

*Primary Examiner* — Hal Kaplan
*Assistant Examiner* — Thai H Tran
(74) *Attorney, Agent, or Firm* — Bradley W. Schield

(57) ABSTRACT

The present disclosure relates to a capacitor bank control system that uses a combination of line post sensors and wireless current sensors for control operations. For example, a capacitor bank controller may include one or more inputs that electrically couple to a line post sensor to allow the capacitor bank controller to obtain line post sensor measurements. The capacitor bank controller may include a transceiver that receives wireless current sensor measurements from first and second wireless current sensors. The capacitor bank controller may include a processor that controls one or more switching devices of a capacitor bank based at least in part on a combination of line post sensor measurements and wireless current sensor measurements.

18 Claims, 5 Drawing Sheets

MULTI-PHASE SENSING AND CONTROL USING A COMBINATION OF LINE POST SENSORS AND WIRELESS CURRENT SENSORS

TECHNICAL FIELD

The present disclosure relates generally to capacitor bank control and, more particularly, to a capacitor bank that has a combination of line post sensors and wireless current sensors.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Figure 1:
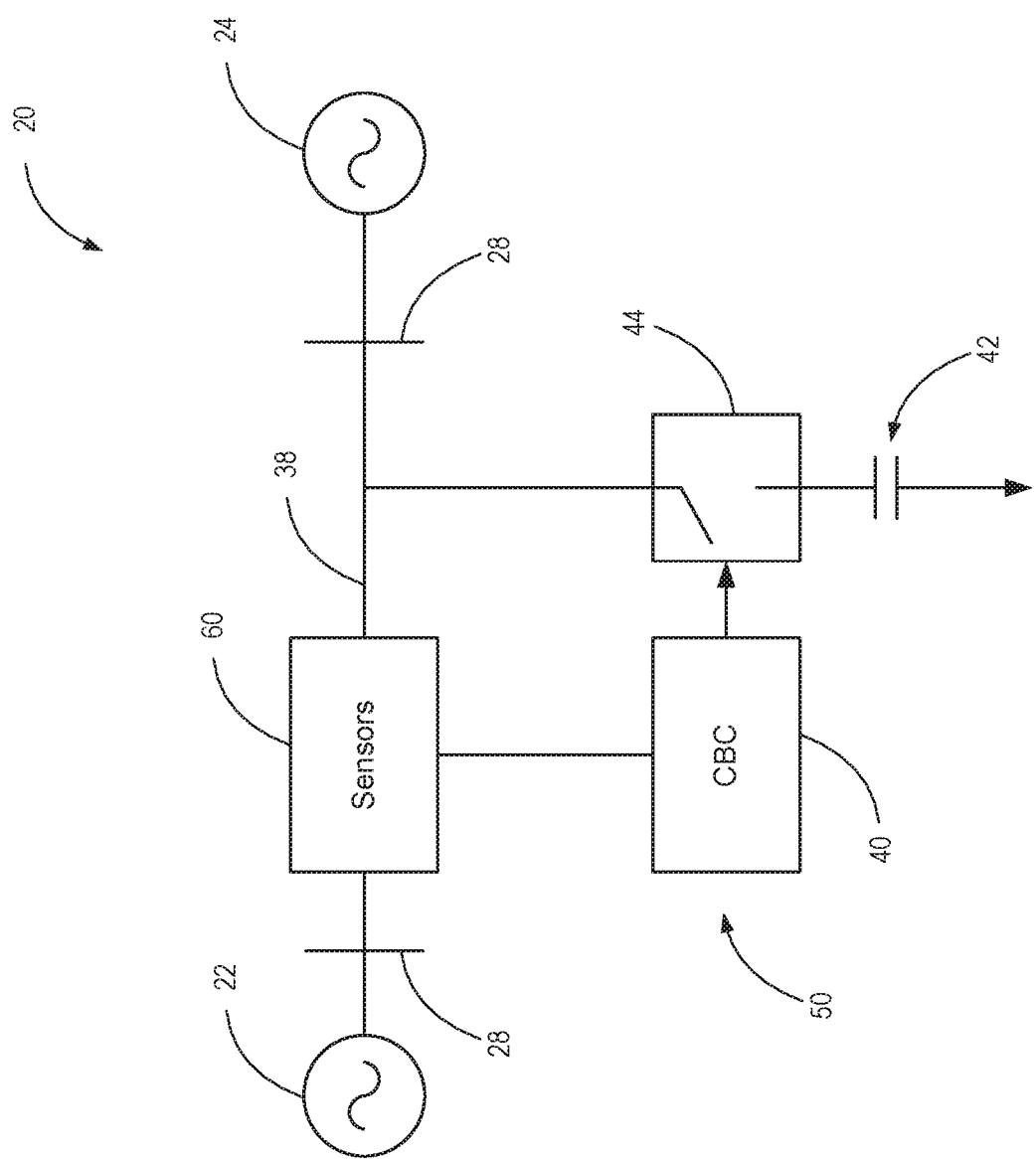
FIG. 1 is a one-line diagram of an electric power delivery system having a capacitor bank control system that controls a capacitor bank, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Various intelligent electronic devices (IEDs) may be used in monitoring and control of the power delivery system. For example, capacitor bank controllers (CBCs) may control capacitor banks in the power delivery system to control delivery of reactive power. For instance, to perform control operations, the CBC may receive voltage measurements and current measurements of a power line. Depending on the voltage and current on the power line, the CBC may send signal(s) to connect or disconnect the capacitor bank to provide for power factor correction, kilovolt-ampere reactive (kVAR) support, and/or voltage improvement.

The wiring for sensors used by CBCs to monitor the power lines may be costly and increase the complexity of installation. To reduce these costs, some CBCs may monitor a single phase of the power line. For example, a combination voltage and current sensor may be installed on a phase of the power line to allow the CBC to control connecting/disconnecting the capacitor bank on three phases based on the voltages and currents of the single phase. However, depending on the electrical characteristics of the remaining phases, the switching operation can decrease power quality on the other phases that are not being monitored.

As explained below, a combination of wireless current sensors and line post sensors may be used to obtain multi-phase sensing to allow ganged and/or single pole switching based on electrical measurements of each of the phases. As an example, a capacitor bank control system may include one or more line post sensors that provide an electrical signal indicating electrical characteristics of a phase of a power line. The capacitor bank control system may include one or more wireless current sensors that provide wireless signals indicating current measurements of additional phases of the power line. The capacitor bank control system may include a CBC that receives the combination of electrical signals from the line post sensor and wireless signals from the wireless current sensors. The CBC may control switching of the capacitor bank based on the current measurements of each phase of the power line.

FIG. 1 illustrates a one-line diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system includes a first power source 22 and a second power source 24 and buses 26 and 28. The buses 26 and 28 may include one or more loads that consume power from the first power source 22 and the second power source 24. The electric power delivery system includes a power line 38 that is communicatively coupled between the first power source 22 and the second power source 24 to deliver power from the power sources 22 and 24 to the loads on the buses 26 and 28.

The electric power delivery system 20 may be monitored by capacitor bank controller (CBC) 40 that controls a capacitor bank 42 by sending signals to a switch 44 to electrically connect or disconnect the capacitor bank 42 from the power line 38. While illustrated as a single capacitor, note that several capacitors may be used and the particular size of the capacitor bank may depend on the application.

The CBC 40 may obtain electric power system information using one or more sensors 60. Line post sensors may be mounted on a power line or other structure of the power line post to monitor the current and/or voltage of the power line 38. For example, line post sensors may include, for example, current transformers that provide a signal indicating current on the power line 38 and/or potential transformers that provide a signal indicating voltage on the power line 38. Although illustrated in single-line form for purposes of simplicity, the electric power delivery system 20 may be a multi-phase system, such as a three-phase electric power delivery system.

In some cases, a line post sensor may be installed on a single phase of the multi-phase system to obtain currents and/or voltages on that particular phase of the power line. The CBC 40 may then control the switching device 44 based on the currents and/or voltages of the monitored phase of the power line 38.

Figure 2:
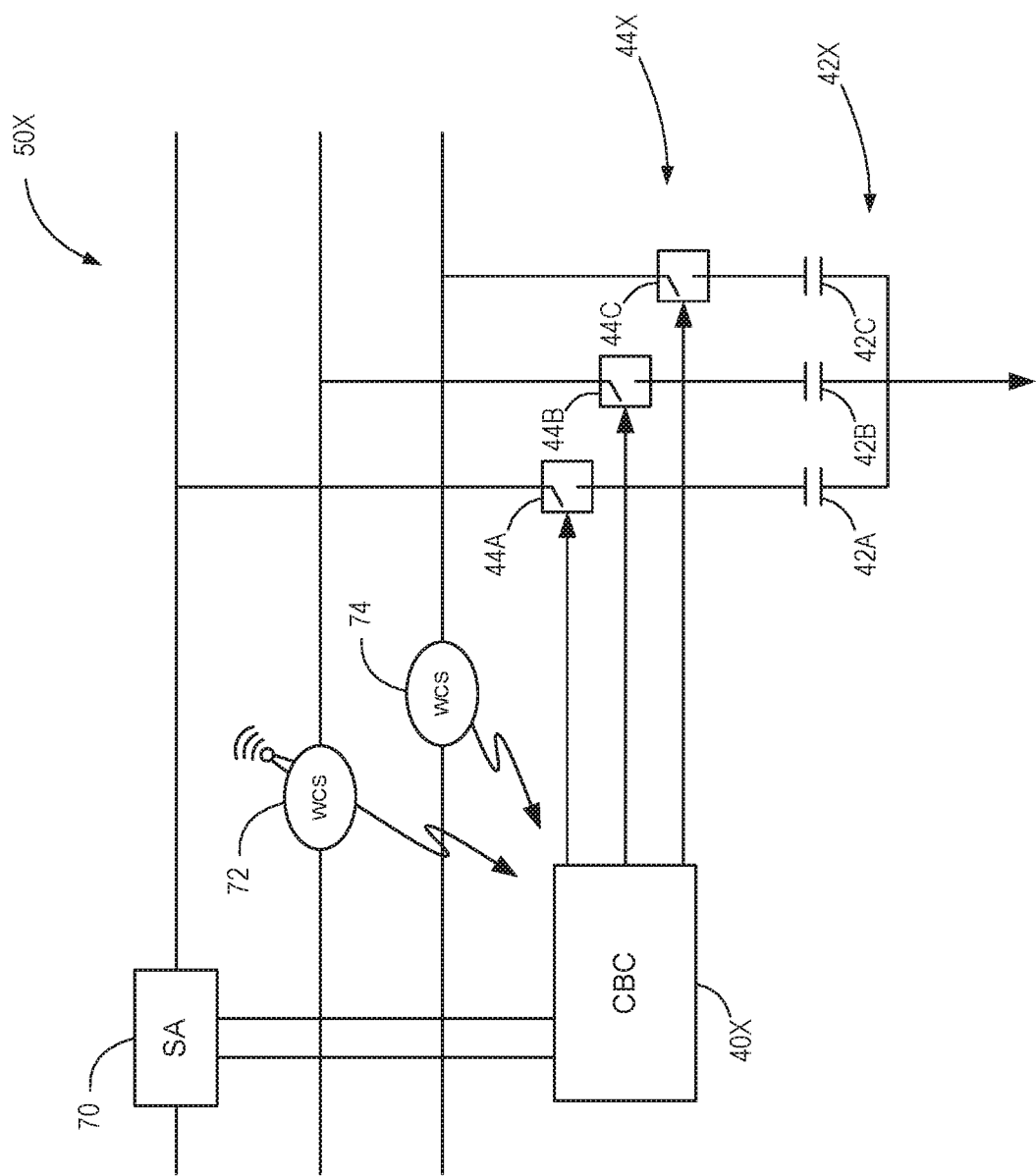
FIG. 2 is a circuit diagram of the capacitor bank control system of FIG. 1 in a three-phase electric power delivery system that controls the capacitor bank using a combination of line post sensor measurements and wireless current sensor measurements, in accordance with an embodiment.

FIG. 2 is an embodiment of a three phase power system with a capacitor bank control system 50X that uses a combination of line post sensors and wireless current sensors to control connecting and/or disconnecting of the capacitor bank 42X. As illustrated, the capacitor bank control system 50X includes a line post sensor 70, which may be a combination sensor that detects current and voltage of the A-phase of the powerline 38X. In other embodiments, the CBC 40X may use a separate potential transformer (PT) to measure voltage as well as the line post sensor 70 to measure current.

As mentioned above, it may be costly to run connections to line post sensors on each phase of the power line. To reduce costs, the CBC 40X may be commissioned to detect voltages and currents of the A-phase via a line post sensor 70. Based on the voltage and currents of the A-phase, the CBC 40X may control the three phases. However, as mentioned above, performing ganged switching based on a single phase may reduce power quality depending on the electrical characteristics of the remaining phases.

As illustrated, the capacitor bank control system 50X may include wireless current sensors 72 and 74 coupled to the B and C phases of the power line that allow the CBC 40X to control electrical connection and disconnection of the capacitor bank to the power line 38 based in part on current measurements of the remaining phases to ensure improvement in the power quality of the power system. The wireless current sensors 72 and 74 may communicate wireless current measurements, such as current magnitude and current phase, of the B phase and the C phase to the CBC 40X. The CBC 40X may include a transceiver that receives the wireless current sensor measurements from the wireless current sensors 72 and 74.

The CBC 40X may perform control operations of the capacitor bank 42X by sending control signals to the one or more switching devices 44A-C of the capacitor bank based on a combination of the line post sensor measurements from the line post sensor 70 and the wireless current measurements from wireless current sensors 72 and 74. As illustrated, the CBC 40X may send individual control signals (e.g., open or close signals) to each of the switches 44A-C to perform single pole switching in a current control scheme. For example, the CBC 40X may individually control switch 44A based on the current of the A-phase from the line post sensor 70, control switch 44B based on the current of the B-phase from the wireless current sensor 72, and control switch 44C based on the current of the C-phase from the wireless current sensor 74.

In some embodiments, the CBC 40X may estimate voltages for the B-phase and C-phase based on the voltage measurement from the A phase and perform power factor or VAR control on each of three phases. The CBC 40X may determine a power factor of the B-phase and C-phase based on the zero crossings from the wireless current measurements and an estimated zero crossing derived from the voltage measurements of the A-phase (e.g., estimated to be 120 degrees offset from voltage measurements of the A-phase). Based on the estimated power factor of the B-phase and/or C-phase, the CBC 40X may send close signal(s) to switches 44B and 44C to increase the capacitance via the capacitor bank thereby improving the power factor of the B-phase and/or C-phase. While power factor is given as an example, the CBC 40X may perform VAR control of the capacitor bank 42X using estimated voltages of the B-phase and C-phase based on the measured voltage of the A-phase to control the switches 44A-C individually. In some embodiments, the CBC 40X may control three phases according to a first control scheme (e.g., power factor control scheme) and use additional controls on other phases (e.g., the B-phase and C-phase) according to a second control scheme (e.g., current control or VAR control).

Figure 3:
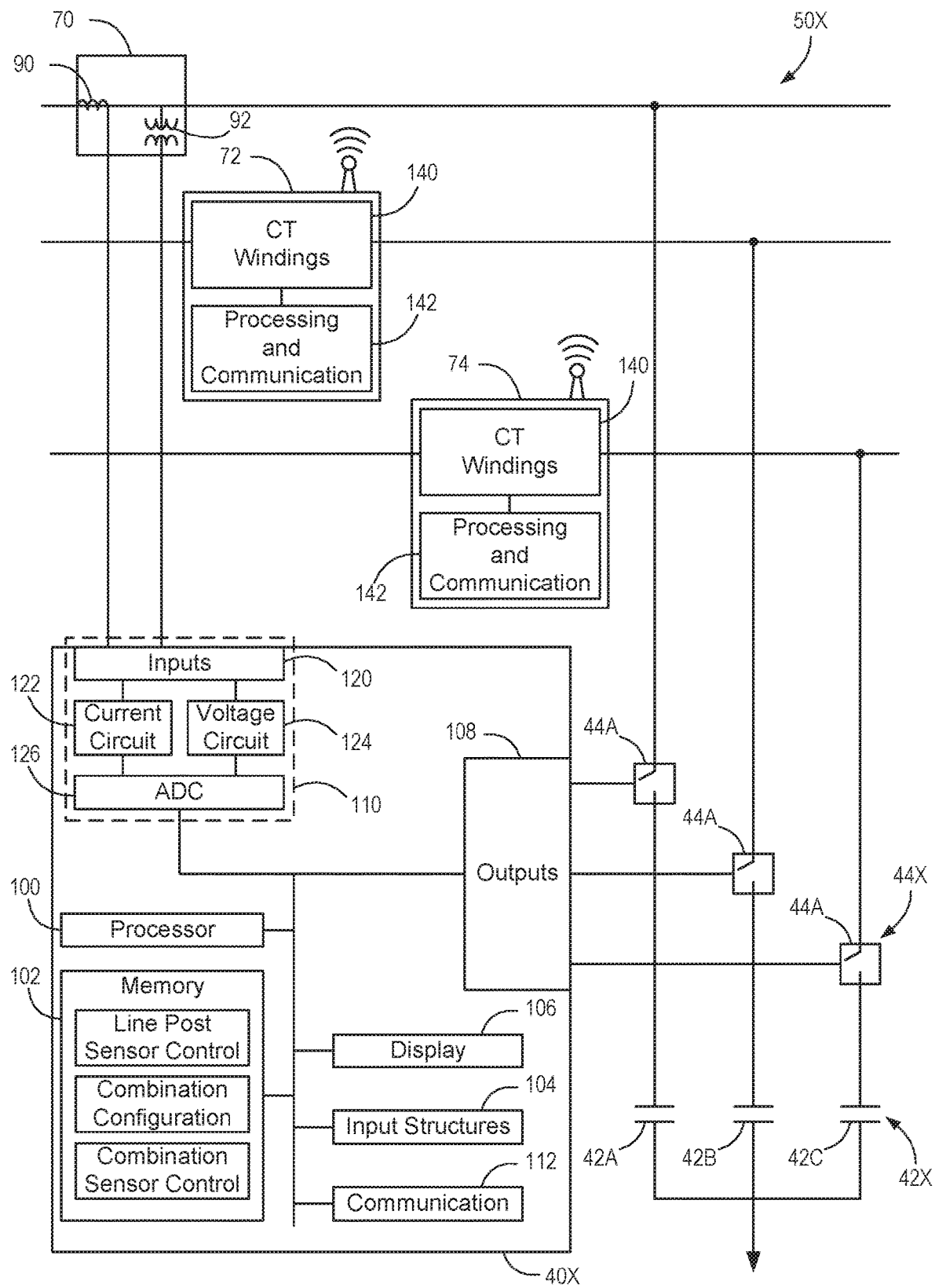
FIG. 3 is a block diagram of the capacitor bank control system in the three-phase electric power delivery system of FIG. 2, in accordance with an embodiment.

FIG. 3 is an embodiment of a block diagram of a capacitor bank control system 50X that uses a line post combination sensor 70 and wireless current sensors 72 and 74 to perform control operations of a capacitor bank 42X. As illustrated, the CBC 40X may be communicatively coupled to the combination sensor 70 via cabling (e.g., one or more conductors) to receive signal(s) indicating current measurements and voltage measurements of the A-phase of the power line 38.

In the illustrated embodiment, the CBC 40X includes a processor 100, a computer-readable storage medium 102, input structures 104, a display 106, output circuitry 108, sensor circuitry 110, and communication circuitry 112. The CBC 40X may include one or more bus(es) 114 connecting the processor 100 or processing unit(s) to the computer-readable storage medium 102, the input structures 104, the display 106, the output circuitry 108, the sensor circuitry 110, and/or the communication circuitry 112. The computer-readable storage medium 102 be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins 120 or connectors that receive voltage signal(s) and current signals(s) from the line post sensor 70. The line post sensor 70 is a combination current and voltage sensor that measures current via a current transformer 90 and measures voltages via a voltage transformer 92. In other embodiments, the line post sensor 70 may simply provide current measurements and a separate PT may provide voltage measurements. The line post sensor 70 may receive power from the CBC 40X. The sensor circuitry 110 may transform the current and voltage signals using an internal current circuit 122 and an internal voltage circuit 124 to a level that may be measured (e.g., via internal transformers), and sample the signals using, for example, A/D converter(s) 126 to produce digital signals representative of measured voltage and measured current on the power line 38. The A/D converter 126 may be connected to the processor 100 by way of the bus 114, through which digitized representations of voltage signals may be transmitted to the processor 100.

The communication circuitry 112 may include communication ports, such as ethernet and serial ports. In some embodiments, the CBC 40X may remotely control switches of the capacitor banks using by communicating using the ethernet or serial ports. Further, the communication circuitry 112 may include a wireless transceiver to communicate with one or more electronic devices, such as the wireless current sensors 72 and 74. The CBC 40X may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the CBC 40X. In some embodiments, the display 106 may be a touchscreen display.

In addition to one or more line post sensors 70 that are electrically connected to inputs of the CBC 40X, the capacitor bank control system 50X may include one or more wireless current sensors 72 and 74. The wireless current sensor 72 and 74 may include current transformer windings 140 and processing and communication circuitry 142. The current transformer windings 140 may detect current proportional to the current on the power line 38 to allow for monitoring of the power line 38. The processing and communication circuitry 142 may include any suitable electrical components (e.g., processor, memory, etc.) to communicate current measurements from the windings 140 to the CBC 40. For example, the processing and communication circuitry 142 may include a transceiver configured to send wireless signals to the transceiver of the CBC 40X to communicate current measurements of the power line 38. The wireless current sensors 72 and 74 may be line-powered and include power harvesting circuitry that harvests power from the power line to allow the wireless current sensors 72 and 74 to perform current measurements and to communicate with the CBC 40X.

The wireless current sensors 72 and 74 may communicate current magnitude and/or phase measurements to the CBC 40X. In some embodiments, the wireless current sensors 72 and 74 may communicate zero-crossing information. For example, when current flow changes from positive to negative or negative to positive, the wireless current sensor 72 and 74 may send a signal indicating the time at which the zero-crossing occurred. Further, processor 100 may determine current control operations based on the current measurements or VAR or power factor control based on the current measurements and voltage measurements. The wireless current sensors 72 and 74 may allow for reduced number of input pins 120 and cabling to determine current on one or more phases of the power line 38.

The output circuitry 108 may include one or more output pins or connectors that electrically connect the CBC 40X to the switching device 44X to allow the processor 100 to send control signals to the switching device 44X to control connection or disconnection of the capacitor bank 42X to the power line 38X. As illustrated, the CBC 40X has output connectors that connect switches 44A-C on each phase of the power line 38.

The CBC 40X may be communicatively coupled to the switching device(s) 44X to send signal(s) to the switching device(s) 44X to electrically connect the capacitor bank 42X to or disconnect the capacitor bank 42X from the power line 38X. The switching device 44X may be any suitable switching device or combination of devices that connect or disconnect the capacitor bank 42X, such as metal-oxide-semiconductor field-effect transistors (MOSFETs), relays, switches, etc. Further, the switching device 44X is illustrated as switches that perform individual switching to control each of the phases individually. In other embodiments, the switching device 44X may be a ganged switching device that controls the phases together based on a combination of the line post sensor measurements and wireless current measurements. For example, in a current control scheme, while the line post sensor may indicate that the A-phase is operating as desired with the capacitor bank disconnected, the CBC 40X may send a signal to the ganged switching device to connect the three phases of the capacitor bank 42X if the combination of line post current measurements of the A-phase and wireless current measurements from the B-phase and C-phase indicate that overall performance of the power system may be improved by connection of the capacitor bank 42X.

Figure 4:
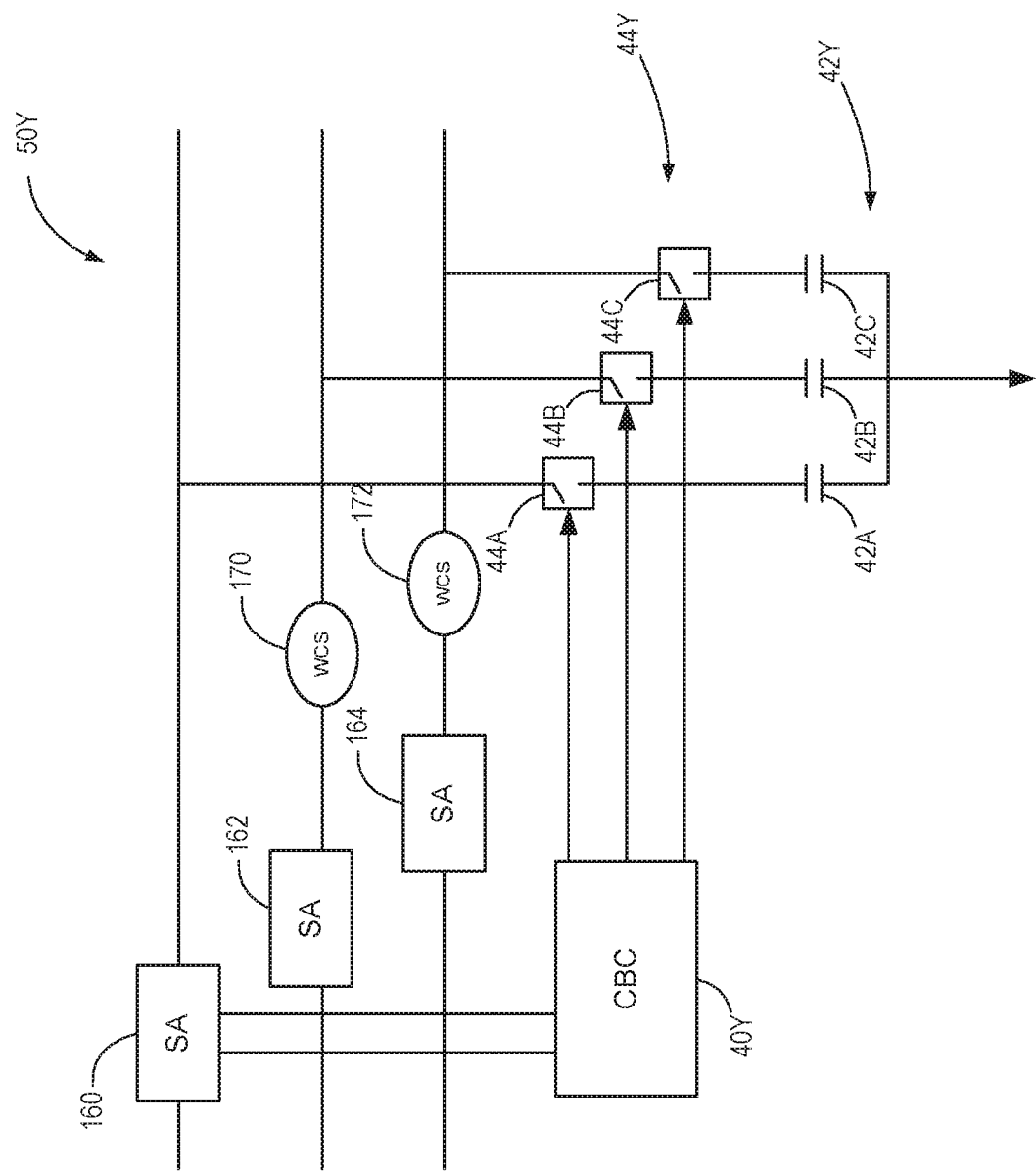
FIG. 4 is a circuit diagram of the capacitor bank control system of FIG. 1 in a three-phase power system that controls the capacitor bank using voltage and current measurements from a combination of line post sensors and wireless current sensors.

While the sensor combination shown in FIG. 3 is similar to the components of FIG. 2, note that the same or similar functions and hardware discussed in block diagram with respect to the CBC 40X and/or the wireless current sensors 72 and 74 may be included in the embodiment of the CBC 40Y and/or the wireless current sensors 170 and 172 described with respect to FIG. 4.

FIG. 4 is another example of the power system 20 with another CBC 40Y that uses a combination of line post sensors 160, 162, and 164 and wireless current sensors 170 and 172 to control connection and disconnection of the capacitor bank 42Y.

As illustrated, the capacitor bank control system 50Y includes a combination line post sensor 160 that detects voltage and current of the A-phase and voltage sensors 162 and 164 that detect voltages of the B-phase and C-phase of the power line 38Y. Further, the CBC 40Y uses wireless current sensors 170 and 172 that detect current on the B-phase and C-phase of the power line 38Y.

Voltage and currents of each phase may be obtained from the combination of line post sensors 160, 162, and 164 and the wireless current sensors 170 and 172 to allow the CBC 40Y to perform control operations that use both voltage and current. For example, the CBC 40Y may perform VAR control or power factor control of each phase of the power line using the corresponding voltage and current measurements.

The VAR control and power factor control may be used to control individual switches 44A-C of each phase of the power line. For example, if the B-phase has a power factor that would benefit from closing of the switch 44B but the C-phase has a different power factor that would benefit from leaving the switch 44C open, the CBC 40Y may close the switch 44B while leaving the switch 44C open to improve power quality in the power delivery system 20.

Figure 5:
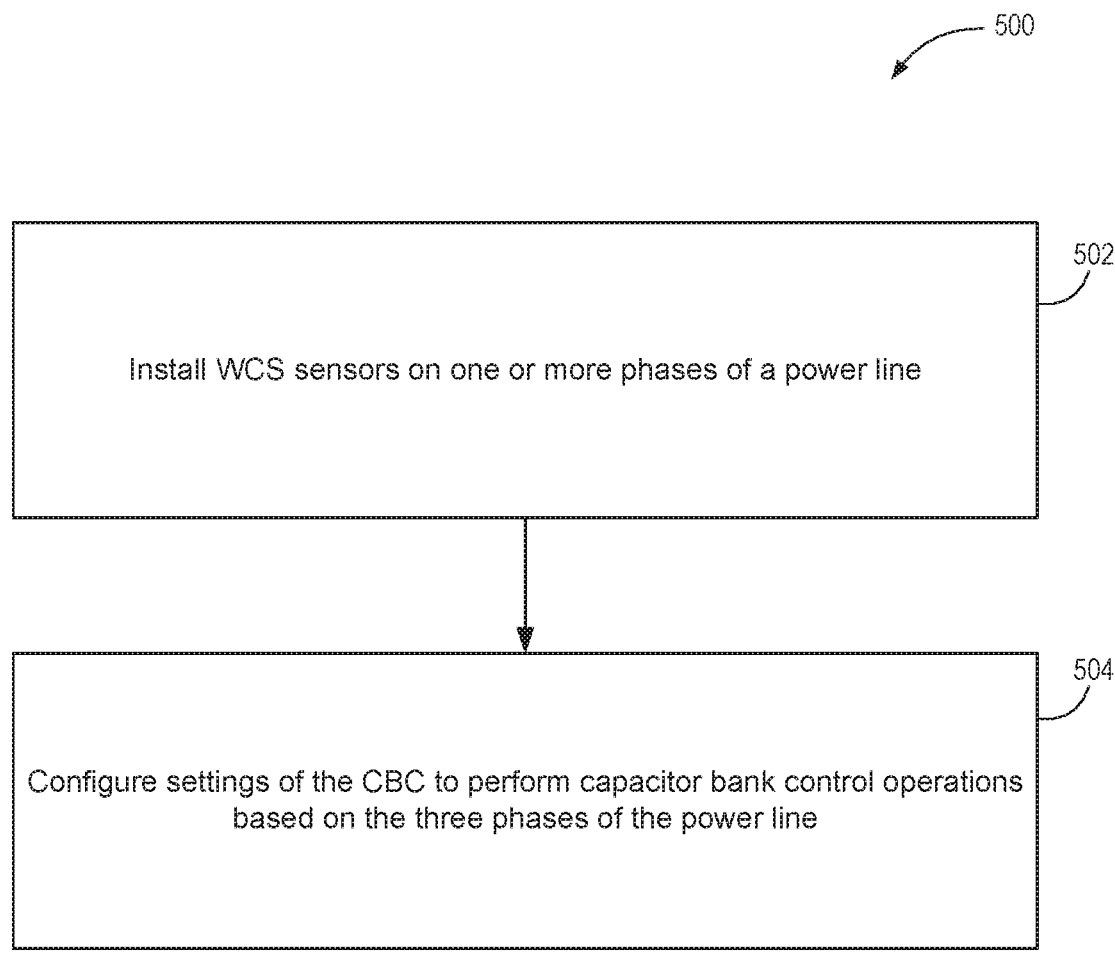
FIG. 5 is a flow diagram of a process that may be performed by voltage and current measurements from a combination of line post sensors and wireless current sensors to operate the capacitor bank controller using a combination of sensors, in accordance with an embodiment.

FIG. 5 is an embodiment of a flow diagram of a process 500 to configure a CBC, such as the CBC 40X and 40Y of FIGS. 2 and 4, to control a capacitor bank based on a combination of line post sensors and wireless current sensors, in accordance with an embodiment. The process 500 may be used to retrofit a CBC 40 that uses line post sensors to control a capacitor bank into using a combination of line post sensors and wireless current sensors to control the capacitor bank. For example, the CBC may initially be commissioned and configured such that the CBC controls the capacitor bank based on line post sensors that are connected to the CBC via cabling (e.g., one or more conductors). In some applications, cabling between the CBC and the line post sensors may be costly resulting in a limited number of line post sensors being installed.

In this example, the CBC may initially perform control operations in a first control scheme that does not include use of current measurements of the remaining power lines. For example, ganged switching may be used where the CBC controls the A-phase, B-phase, and C-phase of the capacitor bank together based on line post sensor measurements of the A-phase of the power line.

The process 500 may include installing wireless current sensors on one or more phases of the power line (block 502). For example, an operator may install the wireless current sensors 72 and 74 by connecting two halves of the CT windings 140 around the phases on the power line via a hot stick while the power line is online, which may allow for easier updating of the CBC than if cabling is run that results in taking the power line offline. Further, the CBC may have a limited number of inputs. By using wireless current sensors, the CBC may communicate with additional wireless current sensors without using additional inputs to the CBC.

The operator may then configure the settings of the CBC to perform capacitor bank control operations in a second control scheme based on a combination of the line post sensor measurements and the wireless current sensor measurements (block 504). That is, the operator may change the CBC from performing control operations using line post sensor measurements from the A-phase to performing control operations using a combination of A-phase, B-phase, and C-phase measurements. To perform the configuration, the operator may provide user settings indicating that a first wireless current sensor is connected to the B-phase and a second wireless current sensor is connected to the C-phase to allow the CBC to use measurements from the wireless current sensors. In other embodiments, the wireless current sensors may communicate settings to the CBC upon installation.

Depending on the implementation, the control scheme may be based on voltage and current measurements (e.g., VAR or PF control) or based on current measurements (e.g., current control). In some embodiments, the CBC may be updated to perform one control scheme on a first phase and another control scheme may be used on the remaining phases. As mentioned above, the CBC may estimate remaining voltages of the phases with wireless current sensors based on the measurement voltages from a line post sensor. Further, due to monitoring the additional phases of the power system, the CBC may then control the phases of the power line individually using individual switching. In other cases, ganged switching may account for the voltages and currents on each of the lines in making decisions to connect or disconnect the three phases together.

By using a combination of line post sensors and wireless current sensors with a CBC, the CBC may allow for better capacitor bank control while reducing the amount of costly cabling used to include additional voltage and current line post sensors. Further, using wireless current sensors may allow for improved updating of CBCs by allowing adding of sensors while the power system is online.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A capacitor bank control system, comprising:
   a first line post sensor configured to detect current on a first phase of a power line;
   a first wireless current sensor configured to detect current on a second phase of the power line;
   a second wireless current sensor configured to detect current on a third phase of the power line; and
   a capacitor bank controller (CBC) comprising:
      an input configured to be electrically coupled to the first line post sensor to obtain line post sensor measurements from the first line post sensor;
      a transceiver configured to receive wireless current sensor measurements from the first wireless current sensor and the second wireless current sensor; and
      a processor configured to:
         receive user settings indicating that the first wireless current sensor is connected to the second phase and the second wireless current sensor is connected to the third phase;
         change the CBC from performing control operations using measurements of a single phase to performing control operations of the first phase, the second phase, and the third phase, while the CBC is online; and
         control one or more switching devices of a capacitor bank based at least in part on a combination of the line post sensor measurements and the wireless current sensor measurements.

2. The capacitor bank control system of claim 1, wherein the first line post sensor comprises a combination sensor that provides the CBC with both current measurements and voltage measurements.

3. The capacitor bank control system of claim 2, comprising:
   a first voltage sensor configured to detect voltage on the second phase of the power line; and
   a second voltage sensor configured to detect voltage on the third phase of the power line.

4. The capacitor bank control system of claim 3, wherein the CBC is configured to perform at least one of voltage-ampere reactance (VAR) control and power factor control on each phase by controlling the one or more switching devices of each phase based on the voltage and current from the respective phase.

5. The capacitor bank of claim 1, wherein the CBC is configured to perform ganged switching control operations to switch the one or more switching devices together to connect or disconnect the capacitor bank phases together based on whether power quality delivered on the power line is expected to improve according to the combination of the line post sensor measurements and the wireless current measurements.

6. The capacitor bank of claim 1, wherein the CBC is configured to perform individual phase switching control operations in which the CBC controls a switching device on each phase of the capacitor bank independently of the remaining phases.

7. A method for configuring a capacitor bank controller (CBC) of a capacitor bank, comprising:
installing a first wireless current sensor on a first phase of a power line;
installing a second wireless current sensor on a second phase of the power line;
inputting a setting on the CBC indicating that the first wireless current sensor and the second wireless current sensor are connected; and
changing settings of the CBC from performing control operations using measurements of a third phase of the capacitor bank that has a line post sensor performing control operations based on electrical measurements from each of the three phases of the power line, wherein the electrical measurements comprise a combination of line post sensor measurements and wireless current sensor measurements.

8. The method of claim 7, wherein installing the first wireless current sensor, installing the second wireless current sensor, and changing settings of the capacitor bank controller are performed while the power line is online to retrofit the CBC with current sensing of the first and second phases.

9. The method of claim 7, wherein the CBC comprises a combination sensor configured to detect both current and voltage of the third phase.

10. The method of claim 9, comprising changing the CBC from performing ganged switching based on electrical measurements from a single phase of the three phases to performing individual switching in which the CBC is configured to:
control electrical connection of the capacitor bank on the first phase based on current measurements from the first wireless current sensor;
control electrical connection of the capacitor bank on the second phase based on current measurements from the second wireless current sensor; and
control electrical connection of the capacitor bank on the third phase based on electrical measurements from the combination sensor, wherein the control of each of the three phases of the capacitor bank is independent of each other.

11. The method of claim 7, comprising installing the first wireless current sensor and the second wireless current sensor via a hot stick.

12. A capacitor bank controller (CBC) for an electric power delivery system, comprising:
one or more inputs configured to be electrically coupled to a first line post sensor of a first phase to allow the capacitor bank controller to obtain line post sensor measurements from the first line post sensor;
a transceiver configured to receive wireless current sensor measurements from a first wireless current sensor of a second phase and a second wireless current sensor of a third phase;
memory; and
a processor operatively coupled to the memory, wherein the processor is configured to:
receive user settings indicating that the first wireless current sensor and the second wireless current sensor are connected;
change the CBC from performing control operations using measurements of a single phase of a capacitor bank to performing control operations using measurements of each phase of the capacitor bank;
obtain the line post sensor measurements via the one or more inputs and the wireless current sensor measurements from the first wireless current sensor and the second wireless current sensor via the transceiver; and
control one or more switching devices of the capacitor bank based at least in part on a combination of the line post sensor measurements and the wireless current sensor measurements.

13. The CBC of claim 12, wherein the processor is configured to individually switch three phases of the capacitor bank based on current measurements from each of the three phases.

14. The CBC of claim 12, wherein the first line post sensor comprises a combination sensor that provides the CBC with both current measurements and voltage measurements.

15. The CBC of claim 12, comprising:
a first voltage sensor configured to detect voltage on the second phase of the power line; and
a second voltage sensor configured to detect voltage on the third phase of the power line.

16. The CBC of claim 15, wherein the CBC is configured to perform at least one of VAR control and power factor control on each phase by controlling the one or more switching devices of each phase based on the voltage and current from the respective phase.

17. The CBC of claim 12, wherein the CBC is configured to perform ganged switching control operations to switch the one or more switching devices together to connect or disconnect each of the capacitor bank phases together based on whether power quality delivered on the power line is expected to improve according to the combination of the line post sensor measurements and the wireless current measurements.

18. The CBC of claim 12, wherein the processor is configured to estimate a voltage of a phase of the power line with the first wireless current based at least in part on voltage measurements of the line post sensor.

* * * * *